(12) United States Patent
Nakagawa et al.

(10) Patent No.: US 9,683,843 B2
(45) Date of Patent: Jun. 20, 2017

(54) VIBRATOR ELEMENT AND METHOD OF MANUFACTURING THE SAME

(71) Applicant: Seiko Epson Corporation, Tokyo (JP)

(72) Inventors: Keiji Nakagawa, Minowa (JP); Ryuta Nishizawa, Matsumoto (JP)

(73) Assignee: Seiko Epson Corporation (JP)

( * ) Notice: Subject to any disclaimer, the term of this patent is extended or adjusted under 35 U.S.C. 154(b) by 476 days.

(21) Appl. No.: 14/225,997

(22) Filed: Mar. 26, 2014

(65) Prior Publication Data

US 2014/0290362 A1   Oct. 2, 2014

(30) Foreign Application Priority Data

Mar. 28, 2013   (JP) .................. 2013-069186

(51) Int. Cl.
*G01C 19/5607* (2012.01)
*G01C 19/5628* (2012.01)
*H03H 3/02* (2006.01)

(52) U.S. Cl.
CPC ..... *G01C 19/5628* (2013.01); *G01C 19/5607* (2013.01); *H03H 2003/026* (2013.01); *Y10T 29/42* (2015.01)

(58) Field of Classification Search
CPC ............ G01C 19/5607; G01C 19/5614; G01C 19/5621; G01C 19/5628
See application file for complete search history.

(56) References Cited

U.S. PATENT DOCUMENTS

| 2007/0182289 | A1 | 8/2007 | Kigawa et al. |
| 2008/0092675 | A1* | 4/2008 | Komine ............. G01C 19/5607 74/5.4 |
| 2010/0116052 | A1* | 5/2010 | Yanagisawa ....... G01C 19/5607 73/504.16 |
| 2010/0171397 | A1 | 7/2010 | Yamada |
| 2012/0103095 | A1 | 5/2012 | Wada et al. |
| 2012/0126664 | A1 | 5/2012 | Ogura et al. |
| 2012/0187803 | A1 | 7/2012 | Yamada |
| 2013/0019681 | A1 | 1/2013 | Shimura et al. |
| 2013/0241364 | A1 | 9/2013 | Yamada |

(Continued)

FOREIGN PATENT DOCUMENTS

| JP | 2007-281377 A | 10/2007 |
| JP | 2008-057995 A | 3/2008 |
| JP | 2010-171966 A | 8/2010 |

(Continued)

*Primary Examiner* — Paul West
*Assistant Examiner* — Xin Zhong
(74) *Attorney, Agent, or Firm* — Harness, Dickey & Pierce, P.L.C.

(57) ABSTRACT

A vibrator element has a first vibration mode in which first and second detection portions perform flexural vibration in opposite directions in the opposite phase to first and second driving portions which vibrate in opposite directions according to a Coriolis force, and a second vibration mode in which the first and second detection portions perform flexural vibration in opposite directions in the same phase as the first and second driving portions which vibrate in opposite directions according to a Coriolis force. A ratio r=R2/R1 of equivalent series resistance R2 at the time of the second vibration mode to equivalent series resistance R1 at the time of the first vibration mode is set between 0.15 and 6.0.

14 Claims, 13 Drawing Sheets

(56) References Cited

U.S. PATENT DOCUMENTS

2013/0255379 A1  10/2013  Nakagawa et al.

FOREIGN PATENT DOCUMENTS

| JP | 2012-098091 A | 5/2012 |
| JP | 2012-112748 A | 6/2012 |
| JP | 2013-024721 A | 2/2013 |
| JP | 2013-205329 A | 10/2013 |

* cited by examiner

VIBRATOR ELEMENT AND METHOD OF MANUFACTURING THE SAME

BACKGROUND

1. Technical Field

The present invention relates to a vibrator element, a gyro sensor using the vibrator element, and an electronic apparatus, a moving object, and the like in which the vibrator element is incorporated.

2. Related Art

For example, as described in JP-A-2012-98091, a vibrator element which is used in a gyro sensor is generally known. If angular velocity movement is applied to a vibrating arm for driving, a vibration direction of the vibrating arm for driving changes due to the action of a Coriolis force. A force component is newly generated in a specific direction in response to the Coriolis force. The force component causes the movement of a vibrating arm for detection. In this way, an output signal according to the force component is output from the vibrating arm for detection. The vibrator element has a first vibration mode and a second vibration mode. In the first vibration mode, the vibrating arms for driving perform flexural vibration in opposite directions next to each other in an out-of-plane direction according to the Coriolis force, and the vibrating arms for detection perform flexural vibration in opposite directions next to each other in an opposite phase to the vibrating arms for driving. In the second vibration mode, the vibrating arms for driving perform flexural vibration in opposite directions next to each other in an out-of-plane direction according to the Coriolis force, and the vibrating arms for detection perform flexural vibration in opposite directions next to each other in the same phase as the vibrating arms for driving.

In JP-A-2012-98091, in improvement in detection sensitivity, a resonance frequency of the first vibration mode and a resonance frequency of the second vibration mode are adjusted. Therefore, in improvement in detection sensitivity, high working accuracy or assembling accuracy is required. For this reason, there is a problem in that if working accuracy or assembling accuracy deteriorates, the detection sensitivity of the vibrator element is reduced.

SUMMARY

An advantage of some aspects of the invention is to provide a vibrator element having high detection sensitivity.

The invention can be implemented as the following forms or application examples.

APPLICATION EXAMPLE 1

This application example is directed to a vibrator element including: first and second detection portions; and first and second driving portions, wherein in a case where a vibration mode in which the first and second driving portions perform flexural vibration in opposite directions is set to be a driving vibration mode, a vibration mode which includes a first vibration that makes the first and second driving portions perform flexural vibration in opposite directions in a case of rotating the vibrator element and a second vibration that makes the first and second detection portions perform flexural vibration in opposite directions in an opposite phase to the first vibration in a case of rotating the vibrator element is set to be a first vibration mode, and a vibration mode which includes a third vibration that makes the first and second driving portions perform flexural vibration in opposite site directions in a case of rotating the vibrator element and a fourth vibration that makes the first and second detection portions perform flexural vibration in opposite directions in the same phase as the third vibration in a case of rotating the vibrator element is set to be a second vibration mode, a ratio $r=R2/R1$ of equivalent series resistance $R2$ of the second vibration mode to equivalent series resistance $R1$ of the first vibration mode is between 0.15 and 6.0.

According to the vibrator element of this application example, it was found by the observation of the inventors of this invention that if the ratio $r=R2/R1$ of equivalent series resistance was between 0.15 and 6.0, angular velocity detection sensitivity was secured in sensitivity greater than or equal to 50% of the maximum sensitivity.

APPLICATION EXAMPLE 2

This application example is directed to the vibrator element according to the application example described above, wherein the vibrator element includes a base portion, the first and second detection portions are first and second vibrating arms for detection which extend along a first direction from the base portion and are arranged along a third direction crossing the first direction, the first and second driving portions are first and second vibrating arms for driving which extend along a second direction opposite to the first direction from the base portion and are arranged along the third direction, the driving vibration mode is a vibration mode in which the first and second vibrating arms for driving perform the flexural vibration in opposite directions along an in-plane direction of a plane which includes the first direction and the third direction, the first vibration mode is a vibration mode which includes the first vibration that makes the first and second vibrating arms for driving perform the flexural vibration in opposite directions along an out-of-plane direction crossing the plane which includes the first direction and the third direction in a case of rotating the vibrator element around an axis parallel to the second direction and the second vibration that makes the first and second vibrating arms for detection perform the flexural vibration in opposite directions in the out-of-plane direction in an opposite phase to the first vibration in a case of rotating the vibrator element around an axis parallel to the second direction, and the second vibration mode is a vibration mode which includes the third vibration that makes the first and second vibrating arms for driving perform the flexural vibration in opposite directions in the out-of-plane direction in a case of rotating the vibrator element around the axis parallel to the second direction and the fourth vibration that makes the first and second vibrating arms for detection perform the flexural vibration in opposite directions in the same phase as the third vibration in a case of rotating the vibrator element around the axis parallel to the second direction.

According to this application example, it was found by the inventors of the invention that if the ratio $r=R2/R1$ of equivalent series resistance was between 0.15 and 6.0, angular velocity detection sensitivity was secured in sensitivity greater than or equal to 50% of the maximum sensitivity.

APPLICATION EXAMPLE 3

This application example is directed to the vibrator element according to the application example described above, wherein the ratio r is between 0.3 and 3.0.

According to this application example, it was found by the inventors of the invention that if the ratio r=R2/R1 of equivalent series resistance was between 0.3 and 3.0, angular velocity detection sensitivity was secured in sensitivity greater than or equal to 70% of the maximum sensitivity.

APPLICATION EXAMPLE 4

This application example is directed to the vibrator element according to the application example described above, wherein the ratio r is between 0.55 and 1.8.

According to this application example, it was found by the inventors of the invention that if the ratio r=R2/R1 of equivalent series resistance was between 0.55 and 1.8, angular velocity detection sensitivity was secured in sensitivity greater than or equal to 90% of the maximum sensitivity.

APPLICATION EXAMPLE 5

This application example is directed to the vibrator element according to the application example described above, wherein the vibrator element further includes a film body which is formed on a surface of at least one of the first and second detection portions.

According to this application example, the film body is fixed to be superimposed on the surface of the detection portion. As a result, the ratio r of equivalent series resistance can be adjusted according to the addition or the removal of the film body.

APPLICATION EXAMPLE 6

This application example is directed to the vibrator element according to the application example described above, wherein the vibrator element further includes a removal mark which is formed adjacent to the film body on the surface of at least one of the first and second detection portions.

According to this application example, the film body is fixed to be superimposed on the surface of the detection portion. As a result, the ratio r of equivalent series resistance can be adjusted according to the removal of the film body.

APPLICATION EXAMPLE 7

The vibrator element according to the application example described above can be used by being incorporated in a gyro sensor. According to this application example, there is provided a gyro sensor having the vibrator element.

APPLICATION EXAMPLE 8

The vibrator element according to the application example described above can be used by being incorporated in an electronic apparatus. According to this application example, there is provided an electronic apparatus having the vibrator element.

APPLICATION EXAMPLE 9

The vibrator element according to the application example described above can be used by being incorporated in a moving object. According to this application example, there is provided a moving object having the vibrator element.

APPLICATION EXAMPLE 10

This application example is directed to a method of manufacturing a vibrator element including: exciting in a vibrator element which includes first and second detection portions and first and second driving portions, a first vibration mode which includes a first vibration that makes the first and second driving portions perform flexural vibration in opposite directions and a second vibration that makes the first and second detection portions perform flexural vibration in opposite directions in an opposite phase to the first vibration and measuring equivalent series resistance R1 of the first vibration mode; exciting a second vibration mode which includes a third vibration that makes the first and second driving portions perform flexural vibration in opposite directions and a fourth vibration that makes the first and second detection portions perform flexural vibration in opposite directions in the same phase as the third vibration in the vibrator element and measuring equivalent series resistance R2 of the second vibration mode; and calculating a ratio r=R2/R1 of the equivalent series resistance R2 of the second vibration mode to the equivalent series resistance R1 of the first vibration mode and performing a suitability determination of the vibrator element.

According to this application example, whether or not the ratio r=R2/R1 of equivalent series resistance is between 0.15 and 6.0 can be determined. In this way, a vibrator element having the ratio r of equivalent series resistance between 0.15 and 6.0 can be manufactured.

APPLICATION EXAMPLE 11

This application example is directed to the method of manufacturing a vibrator element according to the application example described above, wherein the vibrator element includes a base portion, the first and second detection portions are first and second vibrating arms for detection which extend along a first direction from the base portion, the first and second driving portions are first and second vibrating arms for driving which extend along a second direction opposite to the first direction from the base portion, the first and second vibrating arms for detection are disposed side by side along a third direction crossing the first direction, and the first and second vibrating arms for driving are disposed side by side along the third direction, the measuring of the equivalent series resistance R1 of the first vibration mode is energizing the first and second vibrating arms for detection, thereby exciting in the vibrator element the first vibration mode which includes the first vibration that makes the first and second vibrating arms for driving perform the flexural vibration in opposite directions along an out-of-plane direction crossing a plane that includes the first direction and the third direction and the second vibration that makes the first and second vibrating arms for detection perform the flexural vibration in opposite directions along the out-of-plane direction in an opposite phase to the first vibration, and the measuring of the equivalent series resistance R2 of the second vibration mode is energizing the first and second vibrating arms for detection, thereby exciting in the vibrator element the second vibration mode which includes the third vibration that makes the first and second vibrating arms for driving perform the flexural vibration in opposite directions along the out-of-plane direction and the fourth vibration that makes the first and second vibrating arms for detection perform the flexural vibration in opposite directions along the out-of-plane direction in the same phase as the third vibration.

According to this application example, whether or not the ratio r=R2/R1 of equivalent series resistance is between 0.15 and 6.0 can be determined. In this way, a vibrator element having the ratio r of equivalent series resistance between 0.15 and 6.0 can be manufactured.

APPLICATION EXAMPLE 12

This application example is directed to the method of manufacturing a vibrator element according to the application example described above, wherein the method further includes forming a film body on a surface of the vibrating arm for detection on the base portion side.

According to this application example, the film body is fixed to be superimposed on the surface of the vibrating arm for detection. As a result, the ratio r of equivalent series resistance can be adjusted according to the addition of the film body. In this way, a desired vibrator element can be manufactured.

APPLICATION EXAMPLE 13

This application example is directed to the method of manufacturing a vibrator element according to the application example described above, wherein the method further includes removing a film body which is formed on a surface of the detection portion on the base portion side.

According to this application example, the film body can be fixed to be superimposed on the surface of the detection portion in advance. The ratio r of equivalent series resistance can be adjusted according to the removal of the film body. In this way, a desired vibrator element can be manufactured.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of the invention will be described with reference to the accompanying drawings. In addition, this embodiment which will be described below does not unduly limit the contents of the invention stated in the appended claims and all the configurations which are described in this embodiment are not necessarily essential as solving means in the invention.

Figure 1:
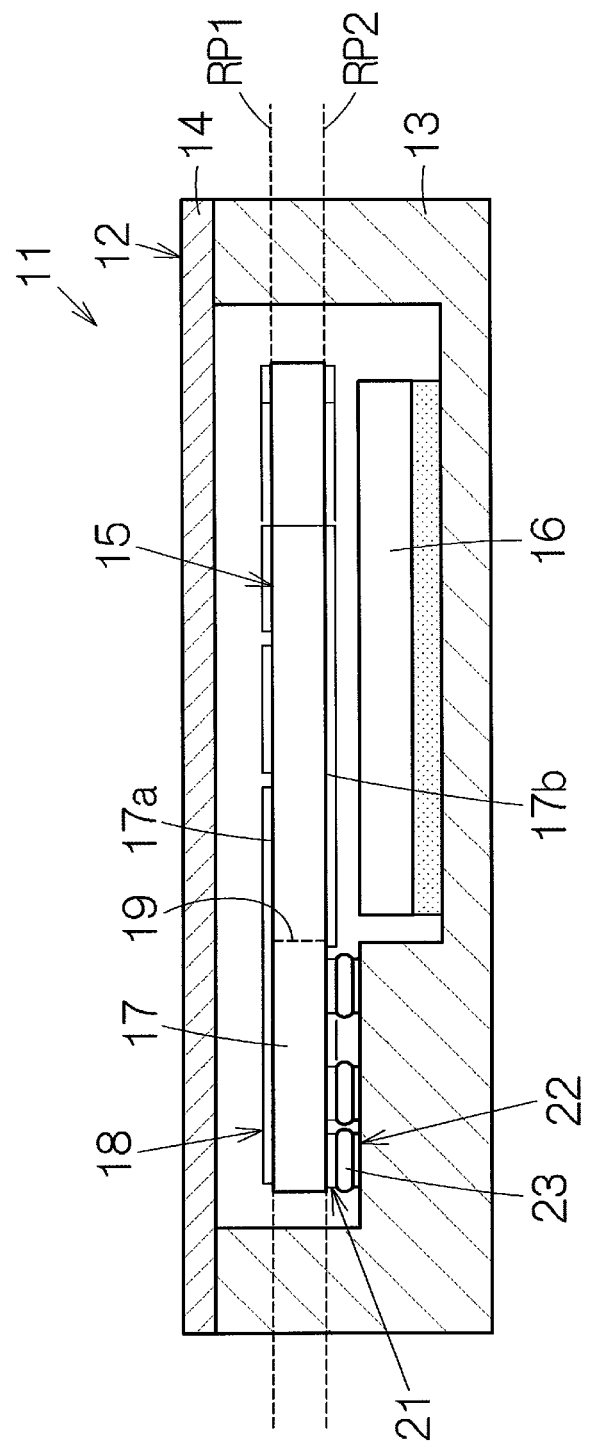
FIG. 1 is a vertical cross-sectional view schematically showing the configuration of a gyro sensor according to an embodiment.

1. Configuration of Gyro Sensor which Includes Vibrator Element According to First Embodiment FIG. 1 schematically shows the configuration of a gyro sensor 11 according to an embodiment. The gyro sensor 11 is provided with a container 12 having, for example, a box shape. The container 12 is provided with a container main body 13 and a cover material 14. An opening of the container main body 13 is covered in an airtight manner with the cover material 14. An internal space of the container 12 can be sealed, for example, in a vacuum. The container 12 functions as a rigid body. At least the cover material 14 can be formed of a conductor. If the cover material 14 is grounded, the cover material 14 can exhibit a shielding effect with respect to electromagnetic waves.

A vibrator element 15 and an integrated circuit (IC) chip 16 are accommodated in the container 12. The vibrator element 15 and the IC chip 16 are disposed in the internal space of the container 12. The vibrator element 15 is provided with a main body 17 and a conductive film 18. The conductive film 18 is laminated on the surface of the main body 17. The conductive film 18 can be formed of a conductive material such as gold (Au), copper (Cu), or other metals. The conductive film 18 can be configured as a thin film or a thick film. As is obvious from FIG. 1, the main body 17 of the vibrator element 15 has a front surface 17a and a back surface 17b. The front surface 17a extends in a first reference plane RP1. The back surface 17b extends in a second reference plane RP2. The second reference plane RP2 extends parallel to the first reference plane RP1. Here, the entirety of the main body 17 is formed of a single piezoelectric body. For example, a quart crystal can be used for the piezoelectric body.

The vibrator element 15 is cantilever-supported on the container main body 13. In the cantilever support, a fixed portion 19 is defined at an end of the main body 17. A connection terminal group 21 is disposed at the fixed portion 19. The connection terminal group 21 is formed in a portion of the conductive film 18 extending on the back surface 17b. The connection terminal group 21 includes a plurality of connection terminals, that is, pads made of a conductive material. The details of the connection terminal will be described later. On the other hand, a conductive terminal group 22 is disposed on a bottom plate of the container main body 13. The conductive terminal group 22 includes a plurality of connection terminals, that is, pads made of a conductive material. The connection terminal group 21 of the vibrator element 15 is joined to the conductive terminal group 22 on the bottom plate. In the joining, a conductive joint material 23 such as a solder bump or a gold bump, for example, can be used. In this way, the vibrator element 15 is fixed to the bottom plate of the container main body 13 at the fixed portion 19. The conductive terminal group 22 is connected to the IC chip 16 by a wiring (not shown) of the conductive film 18. The IC chip 16 may be bonded to, for example, the bottom plate of the container main body 13.

Figure 2:
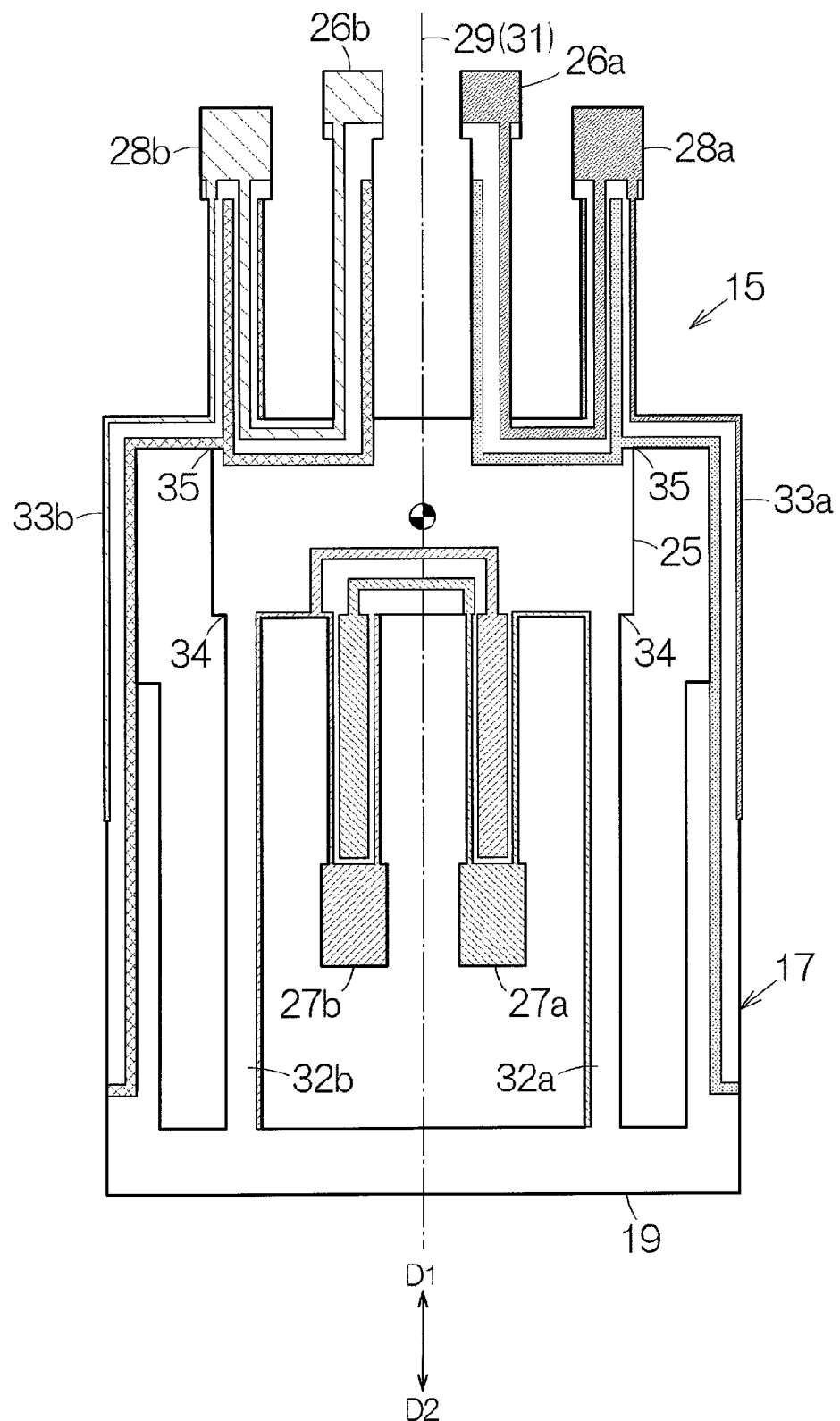
FIG. 2 is an enlarged plan view schematically showing the structure of a vibrator element according to a first embodiment.

As shown in FIG. 2, the main body 17 of the vibrator element 15 according to a first embodiment has a base portion 25, a pair of first vibrating arms 26a and 26b, a pair of second vibrating arms 27a and 27b, and a pair of third vibrating arms 28a and 28b. The front surface 17a and the back surface 17b of the vibrator element 15 are respectively equivalent to the front surfaces and the back surfaces of the first vibrating arms 26a and 26b, the front surfaces and the back surfaces of the second vibrating arms 27a and 27b, and the front surfaces and the back surfaces of the third vibrating arms 28a and 28b. The front surface 17a and the back surface 17b of the vibrator element 15 define a direction of a vibration which is excited by a drive signal, that is, the excitation directions of the second vibrating arms 27a and 27b, as will be described later.

The base portion 25 has predetermined rigidity. An axis of rotation 29 is set in the base portion 25. The axis of rotation 29 passes through the center of gravity of the base portion 25. The gyro sensor 11 detects angular velocity around the axis of rotation 29.

The pair of first vibrating arms 26a and 26b extends side by side in a first direction D1 parallel to the axis of rotation 29 from the base portion 25. The first vibrating arms 26a and 26b are disposed side by side in a direction (a third direction) approximately orthogonal to the axis of rotation 29. The first vibrating arms 26a and 26b are cantilever-supported on the base portion 25. The first vibrating arms 26a and 26b extend parallel to each other. The first vibrating arms 26a and 26b are shaped plane-symmetrically with respect to a plane of symmetry 31 which includes the axis of rotation 29 and is orthogonal to the first and second reference planes RP1 and RP2. Here, the pair of first vibrating arms 26a and 26b is a pair of vibrating arms for detection and functions as a pair of detection portions.

The pair of second vibrating arms 27a and 27b extends side by side in a second direction D2 parallel to the axis of rotation 29 from the base portion 25. The second vibrating arms 27a and 27b are disposed side by side in the direction (the third direction) approximately orthogonal to the axis of rotation 29. The second direction D2 is equivalent to a direction opposite to the first direction D1. The second vibrating arms 27a and 27b are cantilever-supported on the base portion 25. The second vibrating arms 27a and 27b extend parallel to each other. The second vibrating arms 27a and 27b are shaped plane-symmetrically with respect to the plane of symmetry 31. Here, the pair of second vibrating arms 27a and 27b is a pair of vibrating arms for driving and functions as a pair of driving portions.

The pair of third vibrating arms 28a and 28b extends in the first direction D1 from the base portion 25. The third vibrating arms 28a and 28b are cantilever-supported on the base portion 25. The third vibrating arms 28a and 28b extend parallel to each other. The third vibrating arms 28a and 28b are shaped plane-symmetrically with respect to the plane of symmetry 31. Here, the pair of third vibrating arms 28a and 28b is a pair of vibrating arms for adjustment and functions as adjustment portions. A pair of detection arms is disposed in a space between the vibrating arms for adjustment.

The main body 17 of the vibrator element 15 has at least one first hanging arm 32a or 32b and a pair of second hanging arms 33a and 33b. Here, a pair of first hanging arms 32a and 32b is defined in the main body 17. The first hanging arms 32a and 32b respectively extend in the first direction D1 from the fixed portion 19 on both sides of the pair of second vibrating arms 27a and 27b. Leading ends of the first hanging arms 32a and 32b are respectively connected to first connection portions 34 of the base portion 25. Two first connection portions 34 are located on both sides of the pair of second vibrating arms 27a and 27b.

The second hanging arms 33a and 33b respectively extend in the first direction D1 from the fixed portion 19 on both sides of the pair of second vibrating arms 27a and 27b and the pair of first hanging arms 32a and 32b. Leading ends of the second hanging arms 33a and 33b are respectively connected to second connection portions 35 of the base portion 25. The second connection portions 35 are located further in the first direction D1 than the first connection portions 34.

Figure 3:
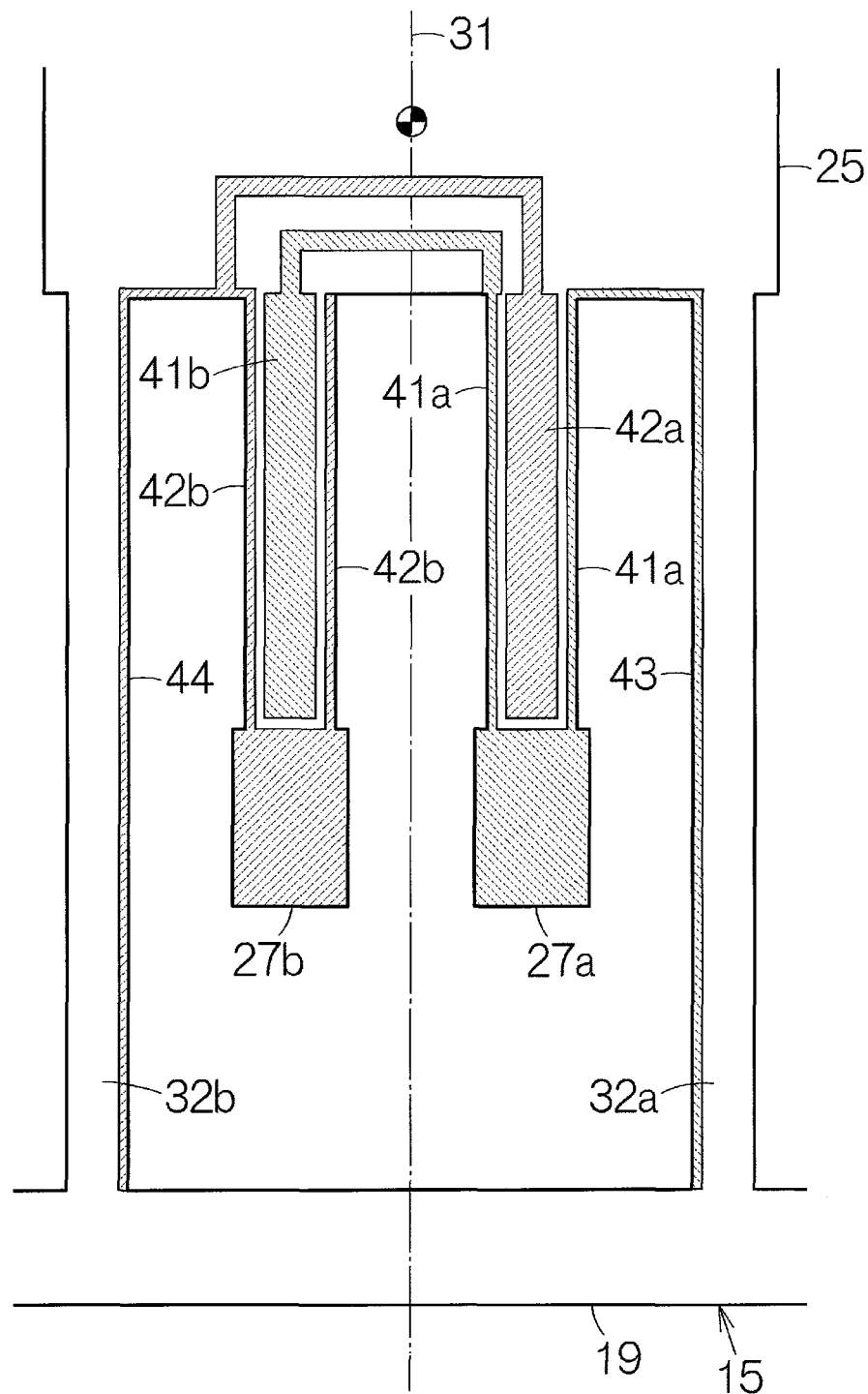
FIG. 3 is an enlarged partial plan view schematically showing the configuration of the surface of a second vibrating arm.

As shown in FIG. 3, the conductive film 18 forms two pairs of first driving electrodes 41a and 41b and two pairs of second driving electrodes 42a and 42b. A first pair of first driving electrodes 41a is fixed to the second vibrating arm 27a on one side. The first driving electrodes 41a extend on the side surfaces of the second vibrating arm 27a. The second vibrating arm 27a is sandwiched between the first driving electrodes 41a. The first driving electrodes 41a are connected to each other on the free end side of the second vibrating arm 27a. A second pair of first driving electrodes 41b is fixed to the second vibrating arm 27b on the other side. The first driving electrodes 41b extend on the front surface 17a and the back surface 17b of the second vibrating arm 27b. The second vibrating arm 27b is sandwiched between the first driving electrodes 41b. The second pair of first driving electrodes 41b is connected to the first pair of first driving electrodes 41a at the base portion 25.

A first pair of second driving electrodes 42a is fixed to the second vibrating arm 27a on one side. The second driving electrodes 42a extend on the front surface 17a and the back surface 17b of the second vibrating arm 27a. The second vibrating arm 27a is sandwiched between the second driving electrodes 42a. A second pair of second driving electrodes 42b is fixed to the second vibrating arm 27b on the other side. The second driving electrodes 42b extend on the side surfaces of the second vibrating arm 27b. The second vibrating arm 27b is sandwiched between the second driving electrodes 42b. The second driving electrodes 42b are connected to each other on the free end side of the second vibrating arm 27b. The second pair of second driving electrodes 42b are connected to the first pair of second driving electrodes 42a at the base portion 25. If an electric field is applied between the first driving electrodes 41a and 41b and the second driving electrodes 42a and 42b, the second vibrating arms 27a and 27b are deformed.

The conductive film 18 forms a first driving wiring 43 and a second driving wiring 44. The first driving wiring 43 is fixed to the first hanging arm 32a on one side. The first driving wiring 43 extends on the first hanging arm 32a over the entire length of the first hanging arm 32a. The first driving wiring 43 is connected to the first driving electrodes 41a and 41b. The second driving wiring 44 is fixed to the first hanging arm 32b on the other side. The second driving wiring 44 extends on the first hanging arm 32b over the entire length of the first hanging arm 32b. The second driving wiring 44 is connected to the second driving electrodes 42a and 42b.

Figure 4:
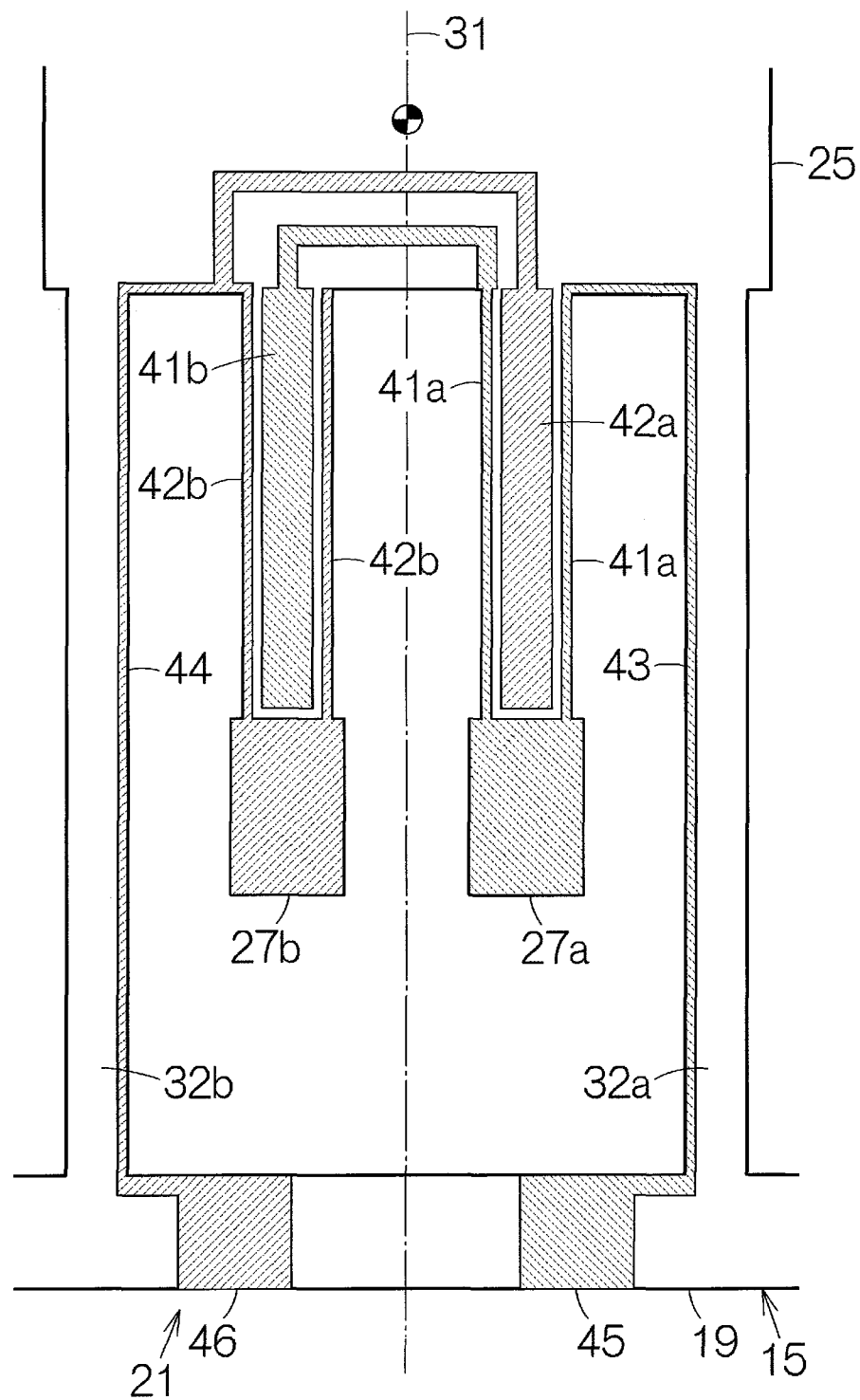
FIG. 4 is an enlarged perspective plan view schematically showing the configuration of the back surface of the second vibrating arm from the front side.

As shown in FIG. 4, the connection terminal group 21 includes a first driving terminal 45 and a second driving terminal 46. The first driving terminal 45 and the second driving terminal 46 are respectively fixed to the back surface 17b of the fixed portion 19. The first driving terminal 45 is connected to the first driving wiring 43. The second driving terminal 46 is connected to the second driving wiring 44. A drive signal can be supplied from the first driving terminal 45 and the second driving terminal 46 to the first driving electrodes 41a and 41b and the second driving electrodes 42a and 42b.

Figure 5:
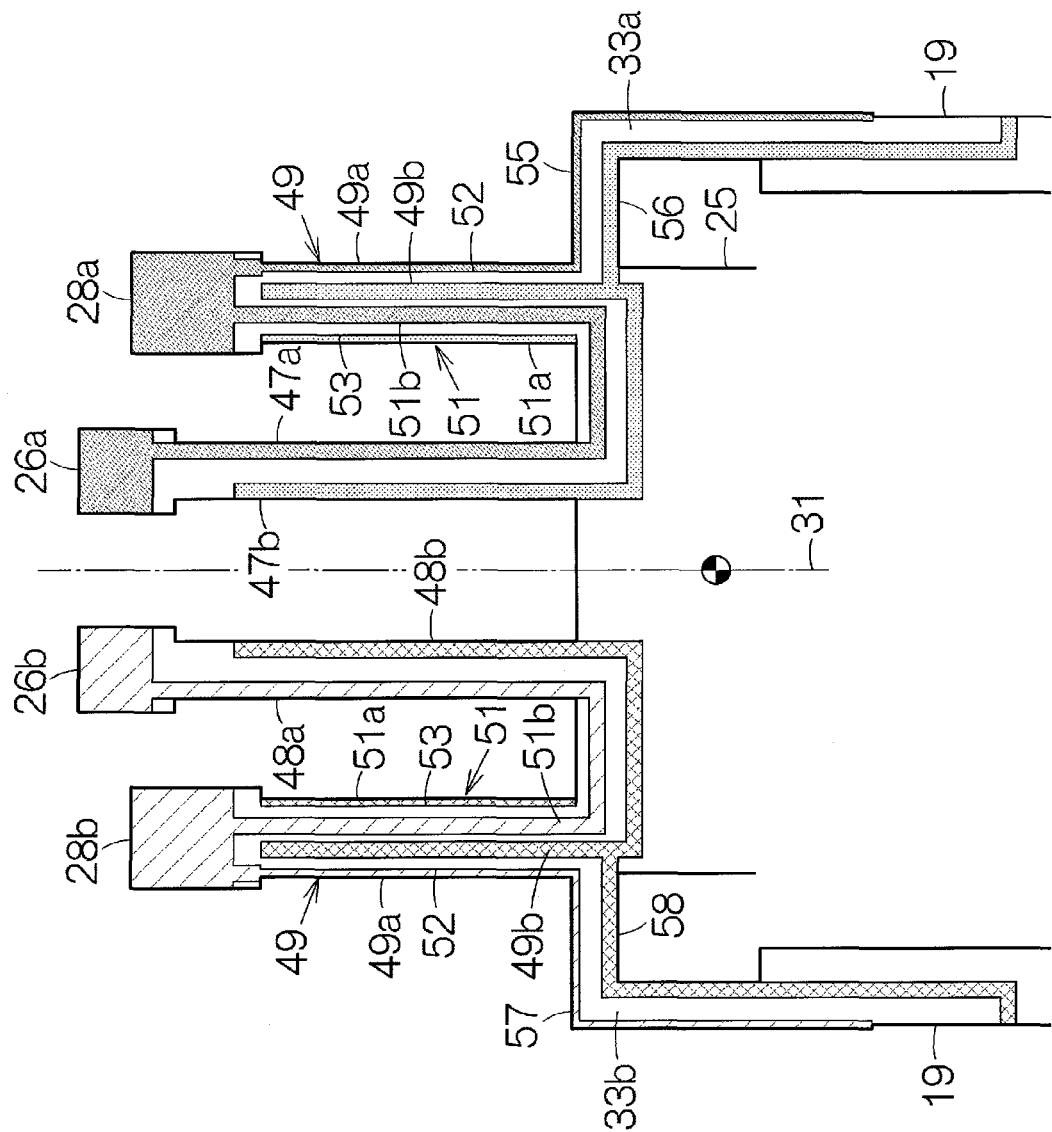
FIG. 5 is an enlarged partial plan view schematically showing the configurations of the surfaces of a first vibrating arm and a third vibrating arm.

The conductive film 18 forms two sets of first detection electrode pairs (a signal electrode 47a and a ground electrode 47b) and two sets of second detection electrode pairs (a signal electrode 48a and a ground electrode 48b). As shown in FIG. 5, the signal electrode 47a and the ground electrode 47b of the first detection electrode pair are fixed to the first vibrating arm 26a on one side. The signal electrode 47a of the first detection electrode pair extends toward the free end from the root of the first vibrating arm 26a on the front surface 17a of the first vibrating arm 26a. The ground electrode 47b of the first detection electrode pair extends toward the free end from the root of the first vibrating arm 26a on the front surface 17a of the first vibrating arm 26a.

The signal electrode 48a and the ground electrode 48b of the second detection electrode pair are fixed to the first vibrating arm 26b on the other side. The signal electrode 48a of the second detection electrode pair extends toward the free end from the root of the first vibrating arm 26b on the front surface 17a of the first vibrating arm 26b. The ground electrode 48b of the second detection electrode pair extends toward the free end from the root of the first vibrating arm 26b on the front surface 17a of the first vibrating arm 26b.

The conductive film 18 forms two sets of first electrode pairs for adjustment 49 and two sets of second electrode pairs for adjustment 51. The first electrode pair for adjustment 49 is fixed to the third vibrating arm 28a. The first electrode pair for adjustment 49 is provided with a first electrode piece 49a and a pair of second electrode pieces 49b. The first electrode piece 49a is disposed on a first side surface 52 of the third vibrating arm 28a.

The second electrode piece 49b on one side is disposed on the front surface 17a of the third vibrating arm 28a. The second electrode piece 49b is adjacent to the first electrode piece 49a across ridge lines of the first side surface 52 and the front surface 17a. A gap is defined along the ridge lines between the first electrode piece 49a and the second electrode piece 49b. An electric current is extracted from the first electrode piece 49a and the second electrode piece 49b according to the deformation of the third vibrating arm 28a.

The second electrode pair for adjustment 51 is likewise fixed to the third vibrating arm 28a. The second electrode pair for adjustment 51 is provided with a third electrode piece 51a and a pair of fourth electrode pieces 51b. The third electrode piece 51a is disposed on a second side surface 53 of the third vibrating arm 28a. The second side surface 53 is located on the side (the back side) opposite to the first side surface 52. The third electrode piece 51a faces the first electrode piece 49a across the third vibrating arm 28a.

The fourth electrode piece 51b on one side is disposed on the front surface 17a of the third vibrating arm 28a. The fourth electrode piece 51b is adjacent to the third electrode piece 51a across ridge lines of the second side surface 53 and the front surface 17a. A gap is defined along the ridge lines between the third electrode piece 51a and the fourth electrode piece 51b. An electric current is extracted from the third electrode piece 51a and the fourth electrode piece 51b according to the deformation of the third vibrating arm 28a.

Similarly, the first electrode pair for adjustment 49 and the second electrode pair for adjustment 51 are fixed to another third vibrating arm 28b. In the fixation, the first side surface 52 and the second side surface 53 are defined on the third vibrating arm 28b, similar to the third vibrating arm 28a. The first electrode piece 49a and the third electrode piece 51a are respectively fixed to the first side surface 52 and the second side surface 53 of the third vibrating arm 28b. The second electrode piece 49b and the fourth electrode piece 51b are fixed to the front surface (a first surface) 17a of the third vibrating arm 28b.

The conductive film 18 forms a first detection wiring 55 and a second detection wiring 56. The first detection wiring 55 and the second detection wiring 56 are fixed to the base portion 25 or the second hanging arm 33a on one side. The first electrode piece 49a and the fourth electrode piece 51b of the third vibrating arm 28a are electrically connected to the first detection wiring 55. The second electrode piece 49b and the third electrode piece 51a are electrically connected to the second detection wiring 56. Similarly, the conductive film 18 forms a third detection wiring 57 and a fourth detection wiring 58. The third detection wiring 57 and the fourth detection wiring 58 are fixed to the base portion 25 or to another second hanging arm 33b. The first electrode piece 49a and the fourth electrode piece 51b of the third vibrating arm 28b are electrically connected to the third detection wiring 57. The second electrode piece 49b and the third electrode piece 51a are electrically connected to the fourth detection wiring 58.

Figure 6:
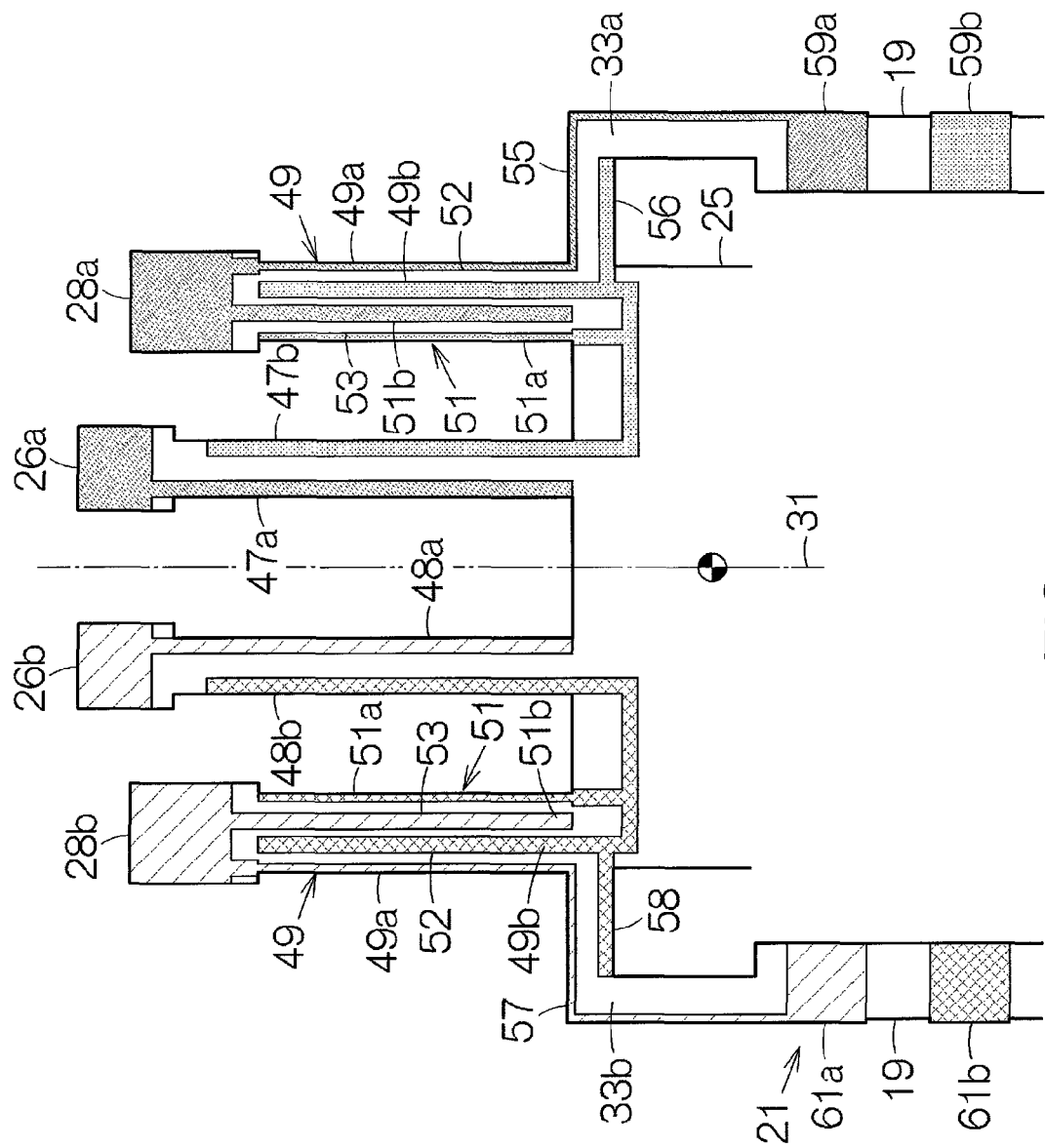
FIG. 6 is an enlarged perspective partial plan view schematically showing the configurations of the back surfaces of the first vibrating arm and the third vibrating arm from the front side.

As shown in FIG. 6, the signal electrode 47a and the ground electrode 47b of the first detection electrode pair are likewise disposed on the back surface 17b of the first vibrating arm 26a. The signal electrode 47a of the back surface 17b can be connected to the signal electrode 47a of the front surface 17a at the free end of the first vibrating arm 26a. The ground electrode 47b of the back surface 17b can be connected to the ground electrode 47b of the front surface 17a at the base portion 25. An electric current is extracted from the signal electrode 47a and the ground electrode 47b according to the deformation of the first vibrating arm 26a.

The signal electrode 48a and the ground electrode 48b are likewise disposed on the back surface 17b of another first vibrating arm 26b. The signal electrode 48a of the back surface 17b can be connected to the signal electrode 48a of the front surface 17a at the free end of the first vibrating arm 26b. The ground electrode 48b of the back surface 17b can be connected to the ground electrode 48b of the front surface 17a at the base portion 25. An electric current is extracted from the signal electrode 48a and the ground electrode 48b according to the deformation of the first vibrating arm 26b.

The second electrode piece 49b on the other side is likewise disposed on the back surface 17b of the third vibrating arm 28a. The second electrode piece 49b is adjacent to the first electrode piece 49a across ridge lines of the first side surface 52 and the back surface 17b. A gap is defined along the ridge lines between the first electrode piece 49a and the second electrode piece 49b. An electric current is extracted from the first electrode piece 49a and the second electrode piece 49b according to the deformation of the third vibrating arm 28a. Similarly, the fourth electrode piece 51b on the other side is disposed on the back surface 17b of the third vibrating arm 28a. The fourth electrode piece 51b is adjacent to the third electrode piece 51a across ridge lines of the second side surface 53 and the back surface 17b. A gap is defined along the ridge lines between the third electrode piece 51a and the fourth electrode piece 51b. An electric current is extracted from the third electrode piece 51a and the fourth electrode piece 51b according to the deformation of the third vibrating arm 28a.

The connection terminal group 21 includes a pair of first detection terminals (a signal terminal 59a and a ground terminal 59b) and a pair of second detection terminals (a signal terminal 61a and a ground terminal 61b). The signal terminal 59a and the ground terminal 59b of the first detection terminal and the signal terminal 61a and the ground terminal 61b of the second detection terminal are fixed to the fixed portion 19. The signal terminal 59a of the first detection terminal is electrically connected to the first detection wiring 55. The ground terminal 59b of the first detection terminal is electrically connected to the second detection wiring 56. The signal terminal 61a of the second detection terminal is electrically connected to the third detection wiring 57. The ground terminal 61b of the second detection terminal is electrically connected to the fourth detection wiring 58. The ground terminal 59b is disposed between the signal terminal 59a and the first driving terminal 45. Similarly, the ground terminal 61b is disposed between the signal terminal 61a and the second driving terminal 46.

Figure 7:
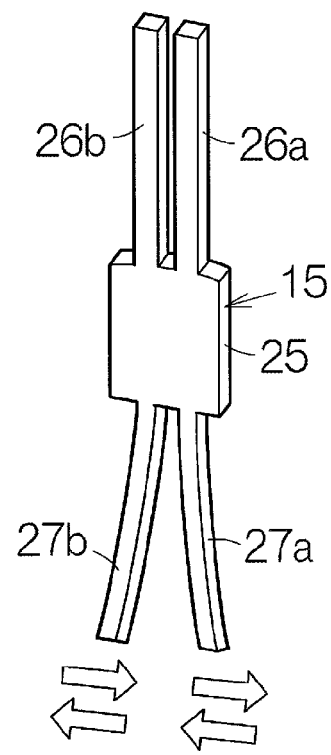
FIG. 7 is a perspective view of the vibrator element schematically showing a state of vibration of the second vibrating arm, that is, a vibrating arm for driving at the time of a driving vibration mode.

2. Operation of Gyro Sensor which Includes Vibrator Element According to First Embodiment Next, an operation of the gyro sensor 11 will be briefly described. As shown in FIG. 7, in angular velocity detection, a driving vibration mode of the second vibrating arms 27a and 27b is established. Vibrations are excited in the second vibrating arms 27a and 27b. In the excitation of the vibration, a drive signal is input from the first driving terminal 45 and the second driving terminal 46 to the vibrator element 15. As a result, an electric field acts on the main body 17 of the vibrator element 15 between the first driving electrodes 41a and 41b and the second driving electrodes 42a and 42b. A waveform of a specific frequency is input, whereby the second vibrating arms 27a and 27b perform flexural vibration between the first reference plane RP1 and the second reference plane RP2. That is, the second vibrating arms 27a and 27b vibrate in opposite directions next to each other in an in-plane direction of an imaginary plane which includes the axis of rotation 29 and is parallel to the first and second reference planes RP1 and RP2 (hereinafter simply referred to as an "imaginary plane"). In this way, the second vibrating arms 27a and 27b repeat moving away from each other or coming close to each other.

Figure 8:
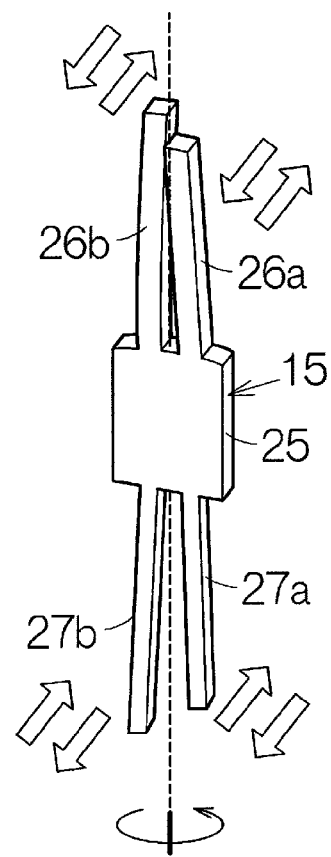
FIG. 8 is a perspective view of the vibrator element schematically showing a state of vibration of the first vibrating arm, that is, a vibrating arm for detection at the time of a first vibration mode.

If angular velocity movement is applied to the gyro sensor 11, as shown in FIG. 8, a Coriolis force is generated by a rotation around the axis of rotation 29. Vibration directions of the second vibrating arms 27a and 27b change according to the action of the Coriolis force. The second vibrating arms 27a and 27b perform flexural vibration in opposite directions next to each other in an out-of-plane direction crossing at right angles to the imaginary plane, that is, parallel to the plane of symmetry 31. So-called walk mode excitation is caused. The second vibrating arms 27a and 27b vibrate parallel to the plane of symmetry 31. At this time, a force component is newly generated parallel to the plane of symmetry 31 in response to the Coriolis force.

The walk mode excitation of the second vibrating arms 27a and 27b is propagated from the base portion 25 to the first vibrating arms 26a and 26b. As a result, vibrations of the first vibrating arms 26a and 26b is caused based on the force component parallel to the plane of symmetry 31. The first vibrating arms 26a and 26b perform flexural vibration in opposite directions next to each other parallel to the plane of symmetry 31. An electric field is generated based on a piezoelectric effect in the first vibrating arms 26a and 26b according to such flexural vibration and electric charges are produced. The flexural vibration of the first vibrating arm 26a generates a difference in potential between the signal electrode 47a and the ground electrode 47b of the first detection electrode pair. Similarly, the flexural vibration of the first vibrating arm 26b generates a difference in potential between the signal electrode 48a and the ground electrode 48b of the second detection electrode pair.

Figure 9:
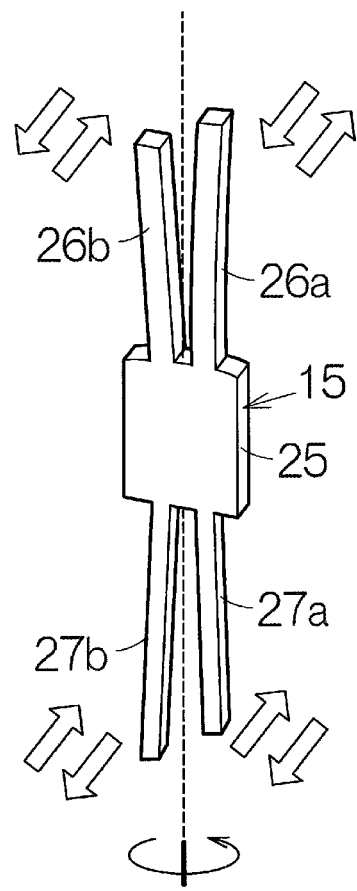
FIG. 9 is a perspective view of the vibrator element schematically showing a state of vibration of the first vibrating arm, that is, the vibrating arm for detection at the time of a second vibration mode.

At this time, if a first vibration mode is established in the vibrator element 15, the first vibrating arms 26a and 26b perform flexural vibration in the opposite phase to the flexural vibration of the second vibrating arms 27a and 27b. That is, as shown in FIG. 8, when the first vibrating arm 26a bends forward and at the same time, the first vibrating arm 26b bends backward, the second vibrating arm 27a bends backward and at the same time, the second vibrating arm 27b bends forward. The second vibrating arms 27a and 27b repeat flexural vibration in this timing. If a second vibration mode is established in the vibrator element 15, the first vibrating arms 26a and 26b perform flexural vibration in the same phase as the flexural vibration of the second vibrating arms 27a and 27b. That is, as shown in FIG. 9, when the first vibrating arm 26a bends forward and at the same time, the first vibrating arm 26b bends backward, the second vibrating arm 27a likewise bends forward and at the same time, the second vibrating arm 27b bends backward. The second vibrating arms 27a and 27b repeat flexural vibration in this timing.

The walk mode excitation of the second vibrating arms 27a and 27b is propagated from the base portion 25 to the third vibrating arms 28a and 28b. As a result, the movements of the third vibrating arms 28a and 28b are caused. An electric signal is output from each of the first electrode pair for adjustment 49 and the second electrode pair for adjustment 51 according to such movements. The electric signal of the first electrode pair for adjustment 49 and the electric signal of the second electrode pair for adjustment 51 are superimposed on the output signals of the first vibrating arms 26a and 26b. The magnitude of the electric signal is adjusted. As a result of the adjustment, the electric signals of the first and second electrode pairs for adjustment 49 and 51 can cancel out a component of leakage vibration. In this way, the S/N ratio of an output signal is improved.

In the vibrator element 15, a ratio r=R2/R1 of equivalent series resistance R2 at the time of the second vibration mode to equivalent series resistance R1 at the time of the first vibration mode is set between 0.15 and 6.0. According to such setting, angular velocity detection sensitivity can be secured in sensitivity greater than or equal to 50% of the maximum sensitivity. Variation in sensitivity for each vibrator element 15 can be reliably reduced. Preferably, the ratio r of the equivalent series resistance R2 at the time of the second vibration mode to the equivalent series resistance R1 at the time of the first vibration mode is set between 0.3 and 3.0. According to such setting, the angular velocity detection sensitivity can be secured in sensitivity greater than or equal to 70% of the maximum sensitivity. Variation in sensitivity for each vibrator element 15 can be more reliably reduced. More preferably, the ratio r of the equivalent series resistance R2 at the time of the second vibration mode to the equivalent series resistance R1 at the time of the first vibration mode is set between 0.55 and 1.8. According to such setting, the angular velocity detection sensitivity can be secured in sensitivity greater than or equal to 90% of the maximum sensitivity. Variation in sensitivity for each vibrator element 15 can be even more reliably reduced.

3. Verification of Detection Sensitivity of Vibrator Element

Figure 10:
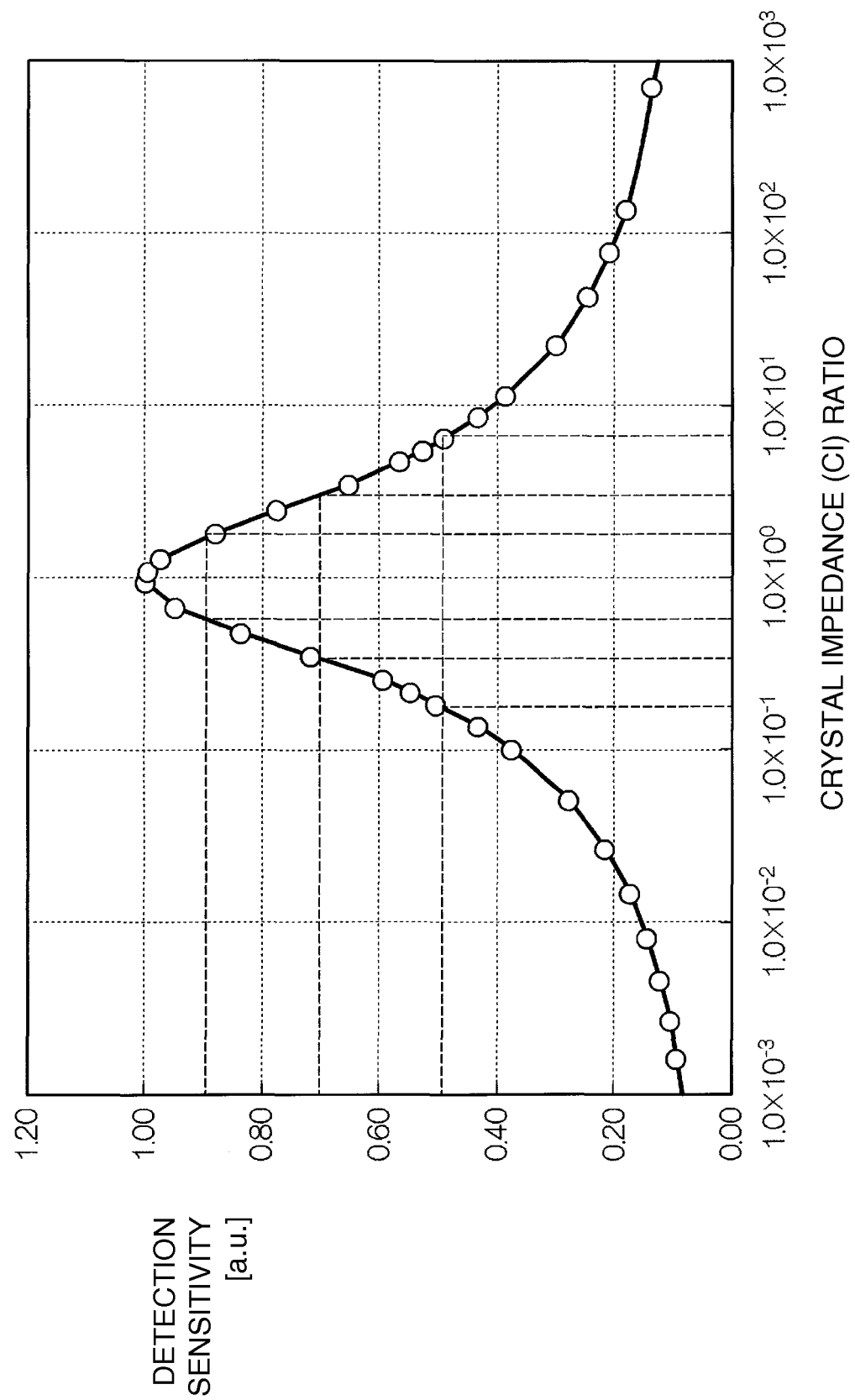
FIG. 10 is a graph showing the relationship between a ratio r=R2/R1 of equivalent series resistance R2 at the time of the second vibration mode to equivalent series resistance R1 at the time of the first vibration mode and detection sensitivity.

The inventors of the invention verified the detection sensitivity of the vibrator element 15. In the verification, simulation was carried out based on computer software. An analytical model of the vibrator element 15 was constructed in the simulation. Modal analysis was carried out based on the analytical model. An alternating current was supplied from the signal electrodes 47a and 48a on the first vibrating arms 26a and 26b. In the analytical model, the first vibration mode and the second vibration mode were set according to the supply of the alternating current. Equivalent series resistance (CI) was calculated in each of the first vibration mode and the second vibration mode. As a result, as shown in FIG. 10, it was found that if the ratio r=R2/R1 of the equivalent series resistance R2 at the time of the second vibration mode to the equivalent series resistance R1 at the time of the first vibration mode was set to be "1.0", the maximum sensitivity of the detection sensitivity could be obtained. In addition, it was found that if the vibrator element 15 showed the ratio r=R2/R1 of equivalent series resistance between 0.15 and 6.0, the angular velocity detection sensitivity was secured in sensitivity greater than or equal to 50% of the maximum sensitivity. It was found that if the vibrator element 15 showed the ratio r of the equivalent series resistance between 0.3 and 3.0, the angular velocity detection sensitivity was secured in sensitivity greater than or equal to 70% of the maximum sensitivity. It was found that if the vibrator element 15 showed the ratio r=R2/R1 of the equivalent series resistance between 0.55 and 1.8, the angular velocity detection sensitivity was secured in sensitivity greater than or equal to 90% of the maximum sensitivity.

4. Method of Manufacturing Vibrator Element According to First Embodiment

In the manufacturing of the gyro sensor 11, the vibrator element 15 is manufactured. The main body 17 of the vibrator element 15 is carved from a quartz crystal body. The conductive film 18 is formed on the main body 17. The conductive film 18 is formed in a pattern as designed. In the formation of the conductive film 18, for example, a photolithographic technique can be used. Here, in the design of the vibrator element 15, the ratio r of equivalent series resistance is adjusted.

The container 12 is prepared. The IC chip 16 is fixed into the container main body 13. Subsequently, the vibrator element 15 is fixed into the container main body 13. The connection terminal group 21 is joined to the conductive terminal group 22. Each of the first and second driving terminals 45 and 46, the first detection terminals 59a and 59b, and the second detection terminals 61a and 61b is received on the corresponding connection terminal. In this way, the vibrator element 15 is electrically connected to the IC chip 16.

The first vibration mode is established in the vibrator element 15. An alternating current is supplied to the signal electrodes 47a and 48a and the ground electrodes 47b and 48b. As a result, an alternating-current electric field is applied to the first vibrating arms 26a and 26b. At this time, the equivalent series resistance R1 at the time of the first vibration mode is measured.

The second vibration mode is established in the vibrator element 15. An alternating current is supplied to the signal electrodes 47a and 48a and the ground electrodes 47b and 48b. As a result, an alternating-current electric field is applied to the first vibrating arms 26a and 26b. At this time, the equivalent series resistance R2 at the time of the second vibration mode is measured. In this way, the ratio r=R2/R1 of the equivalent series resistance R2 at the time of the second vibration mode to the equivalent series resistance R1 at the time of the first vibration mode is calculated. A suitability determination is performed by whether or not the calculated ratio r falls within a predetermined numerical value range. If the calculated ratio r falls within a predetermined numerical value range, the vibrator element 15 is determined to be appropriate and the opening of the container main body 13 is covered in an airtight manner with the cover material 14. The internal space of the container 12 is sealed. The manufacturing of the gyro sensor 11 is completed. If the calculated ratio r does not fall within a predetermined numerical value range, the vibrator element 15 is determined to be inappropriate. In a case where the vibrator element 15 is determined to be inappropriate, the ratio r of equivalent series resistance may be adjusted so as to fall within a predetermined numerical value range by a method, which will be described later.

According to such a manufacturing method, whether or not the ratio r=R2/R1 of equivalent series resistance is within a predetermined numerical value range can be determined. In this way, a vibrator element having the ratio r of equivalent series resistance in a predetermined numerical value range can be manufactured.

5. Structure of Vibrator Element According to Second Embodiment

Figure 11:
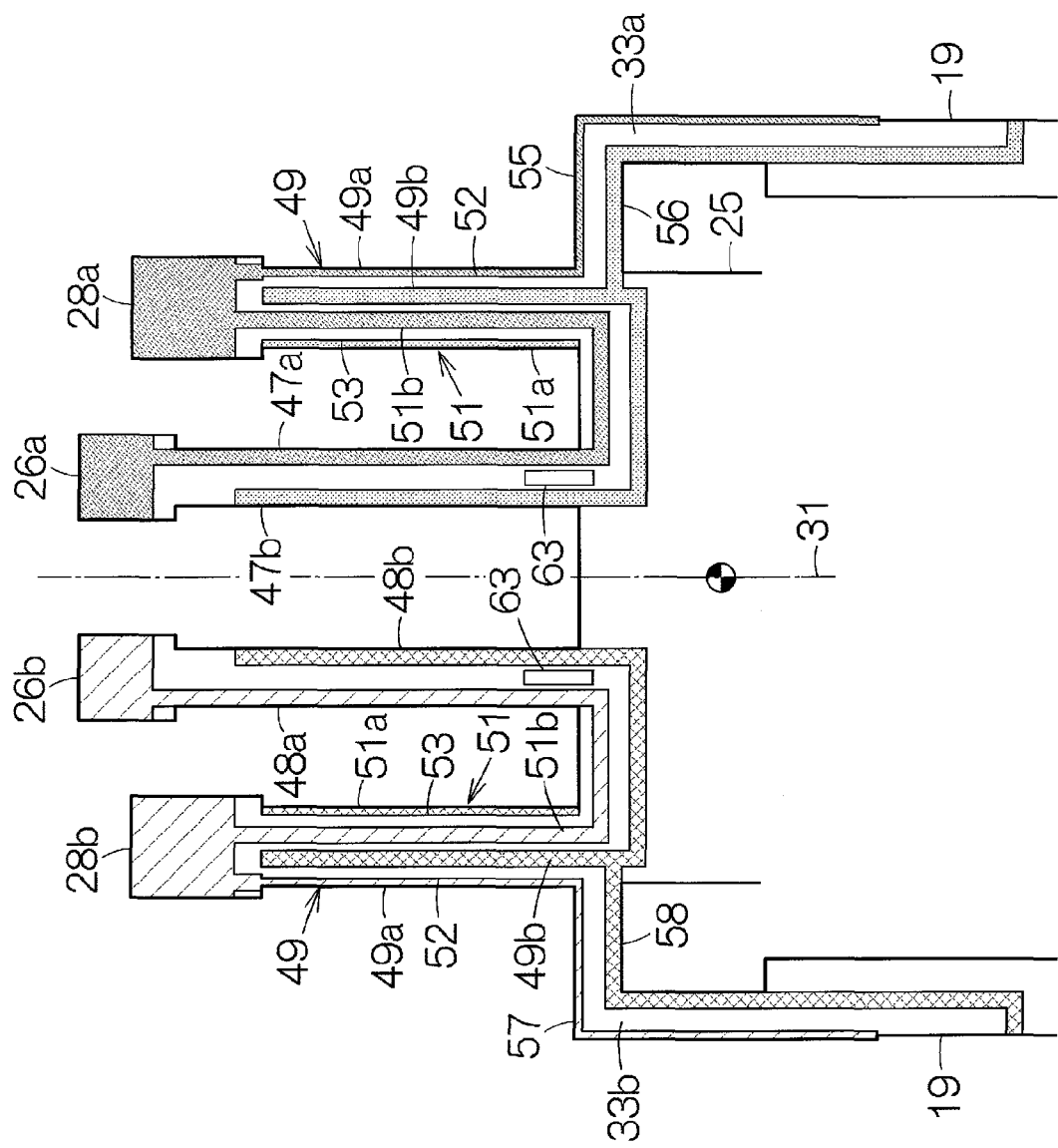
FIG. 11 is an enlarged partial plan view schematically showing the structure of a vibrator element according to a second embodiment.

FIG. 11 shows a portion of a vibrator element 15 according to a second embodiment. In the vibrator element 15, film bodies 63 are formed on the surfaces of the first vibrating arms 26a and 26b on the base portion 25 side. The film body 63 is formed of a metal material, for example, nickel. In addition, the film body 63 may be formed of an insulating material. However, in a case where the film body 63 is formed of a metal material, the film body 63 is electrically separated from the signal electrodes 47a and 48a and the ground electrodes 47b and 48b. The film bodies 63 are fixed to be superimposed on the surfaces of the first vibrating arms 26a and 26b. The film bodies 63 extend toward the free ends from the roots of the first vibrating arms 26a and 26b. The film body 63 may be continuous as far as the surface of the base portion 25. The film bodies 63 can increase rigidity at the roots of the first vibrating arms 26a and 26b. The size or the thickness of the film body 63 may be determined according to an adjustment range of the required rigidity. Other configurations of the vibrator element 15 can be configured in the same manner as the vibrator element 15 of the first embodiment described above. In the vibrator element 15, the ratio r of equivalent series resistance can be set to a predetermined value on the basis of the film body 63. In such setting, the size, the thickness, or the formation position of the film body 63 is adjusted. The film body 63 can be formed by electrolytic plating, non-electrolytic plating, vapor deposition, or other methods. In this way, the ratio r of equivalent series resistance can be adjusted according to the addition of the film body 63. A desired vibrator element 15 can be manufactured.

6. Structure of Vibrator Element According to Third Embodiment

Figure 12:
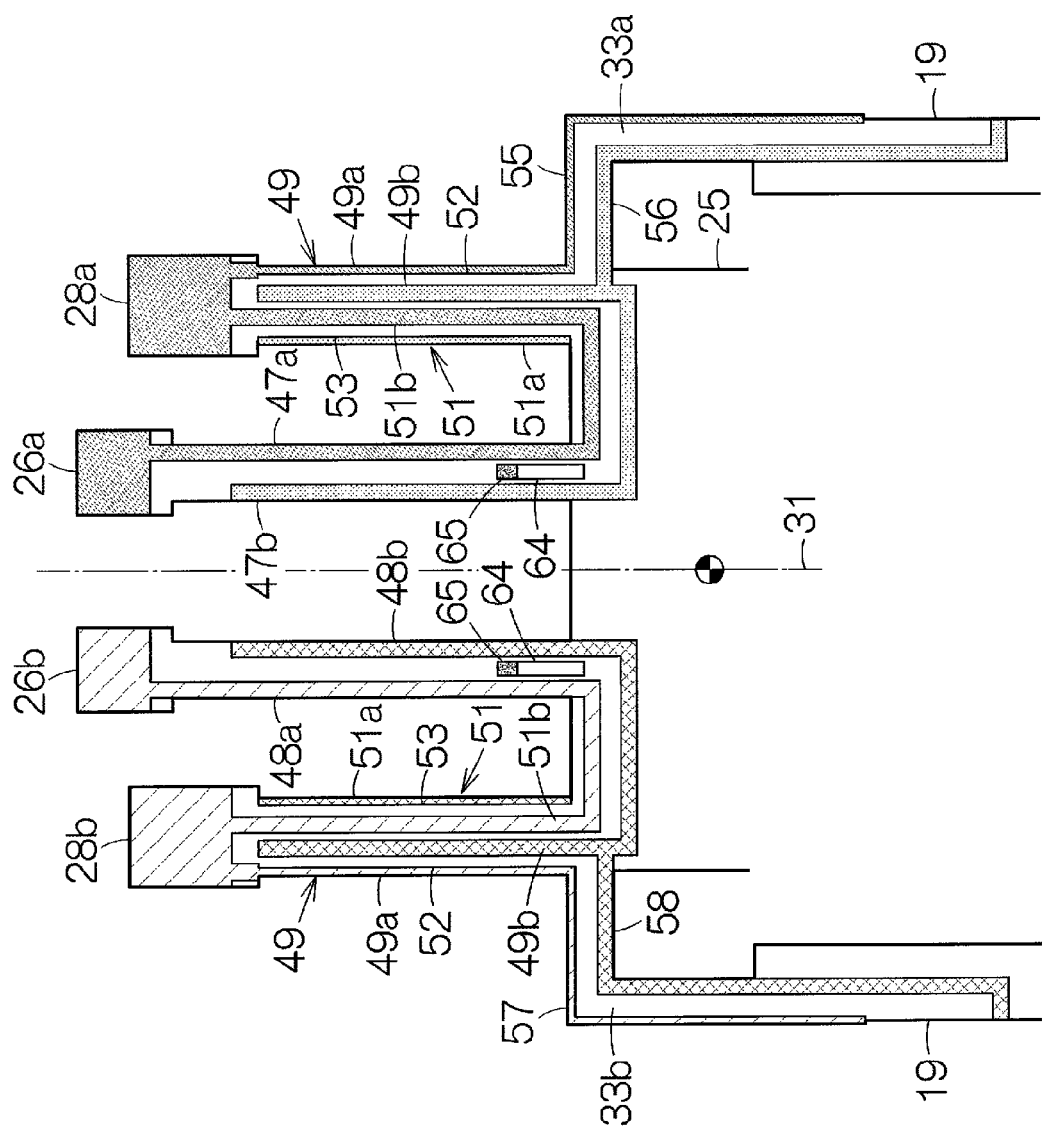
FIG. 12 is an enlarged partial plan view schematically showing the structure of a vibrator element according to a third embodiment.

FIG. 12 shows a portion of a vibrator element 15b according to a third embodiment. In the vibrator element 15b, film bodies 64 are formed on the surfaces of the first vibrating arms 26a and 26b on the base portion 25 side. The film body 64 can be configured in the same manner as the film body 63. A removal mark 65 is formed adjacent to the film body 64 on the surface of each of the first vibrating arms 26a and 26b. The size of the removal mark 65 is determined according to an adjustment range of the required rigidity. Other configurations of the vibrator element 15b can be configured in the same manner as the vibrator element 15 of the first embodiment described above. In the vibrator element 15b, the ratio r of equivalent series resistance can be set to a predetermined value on the basis of the film body 64.

7. Method of Manufacturing Vibrator Element According to Third Embodiment

First, the vibrator element 15 according to the second embodiment is manufactured. At this time, the size of the film body 63 is determined based on the maximum value of an adjustment range of rigidity. The vibrator element 15 is fixed into the container main body 13. The vibrator element 15 is electrically connected to the IC chip 16. In the same manner as described above, in the vibrator element 15, the ratio r=R2/R1 of the equivalent series resistance R2 at the time of the second vibration mode to the equivalent series resistance R1 at the time of the first vibration mode is calculated. If the calculated ratio r falls within a predetermined numerical value range, the opening of the container main body 13 is covered in an airtight manner with the cover material 14. The internal space of the container 12 is sealed. The manufacturing of the gyro sensor 11 is completed.

On the other hand, if the ratio r of equivalent series resistance deviates from a predetermined numerical value range, the film body 63 is partially removed. The ratio r of equivalent series resistance is adjusted according to the removal of the film body 63. In the removal, for example, the film body 63 is irradiated with a laser beam. The film body 63 partially sublimes according to the irradiation of the laser beam. The removal mark 65 is formed according to the sublimation of the film body 63. In this way, the film body 64 adjusted to a predetermined size is formed. A desired vibrator element 15b can be manufactured.

8. Electronic Apparatus and Others

Figure 13:
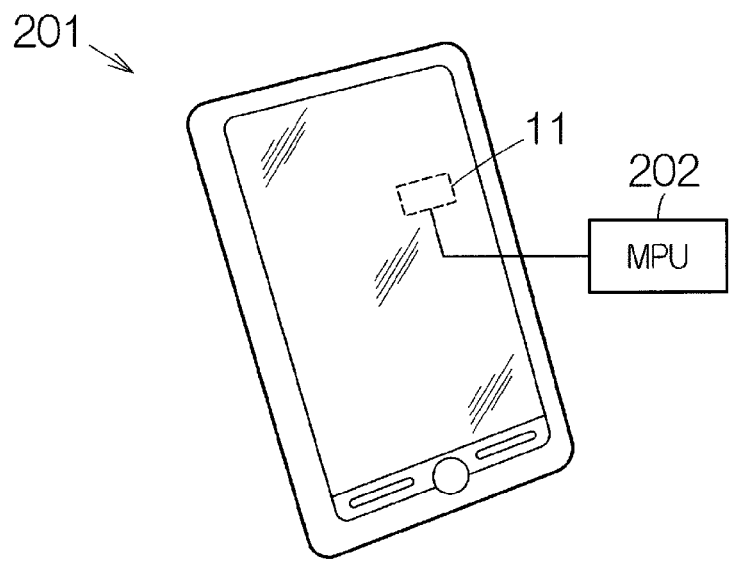
FIG. 13 is a conceptual diagram schematically showing the configuration of a smartphone as a specific example of an electronic apparatus.

FIG. 13 schematically shows a smartphone 201 as a specific example of an electronic apparatus. The gyro sensor 11 having the vibrator element 15 is incorporated in the smartphone 201. The gyro sensor 11 can detect the posture of the smartphone 201. So-called motion sensing is carried out. A detection signal of the gyro sensor 11 can be supplied to, for example, a microcomputer chip (MPU) 202. The MPU 202 can execute various processing according to the motion sensing. In addition, such motion sensing can be used in an electronic apparatus such as a mobile phone, a portable game machine, a game controller, a car navigation system, a pointing device, a head mounting display, and a tablet personal computer. In the realization of the motion sensing, the gyro sensor 11 can be incorporated.

Figure 14:
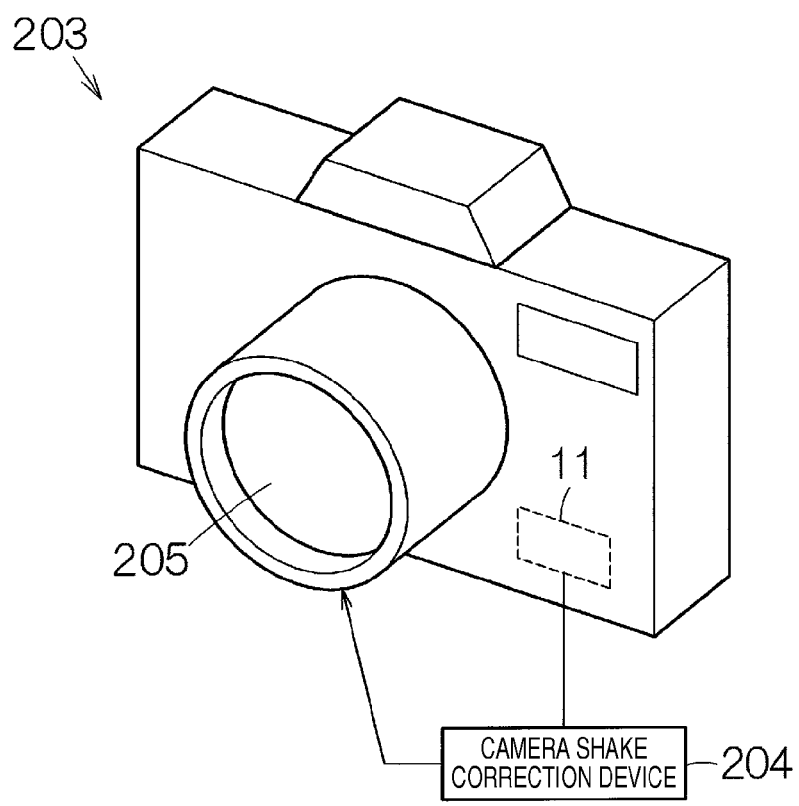
FIG. 14 is a conceptual diagram schematically showing the configuration of a digital still camera as another specific example of the electronic apparatus.

FIG. 14 schematically shows a digital still camera (hereinafter referred to as a "camera") 203 as another specific example of the electronic apparatus. The gyro sensor 11 having the vibrator element 15 is incorporated in the camera 203. The gyro sensor 11 can detect the posture of the camera 203. A detection signal of the gyro sensor 11 can be supplied to a camera shake correction device 204. The camera shake correction device 204 can move a specific lens in, for example, a lens set 205 according to the detection signal of the gyro sensor 11. In this way, a camera shake can be corrected. In addition, the camera shake correction can be used in a digital video camera. In the realization of the camera shake correction, the gyro sensor 11 can be incorporated.

Figure 15:
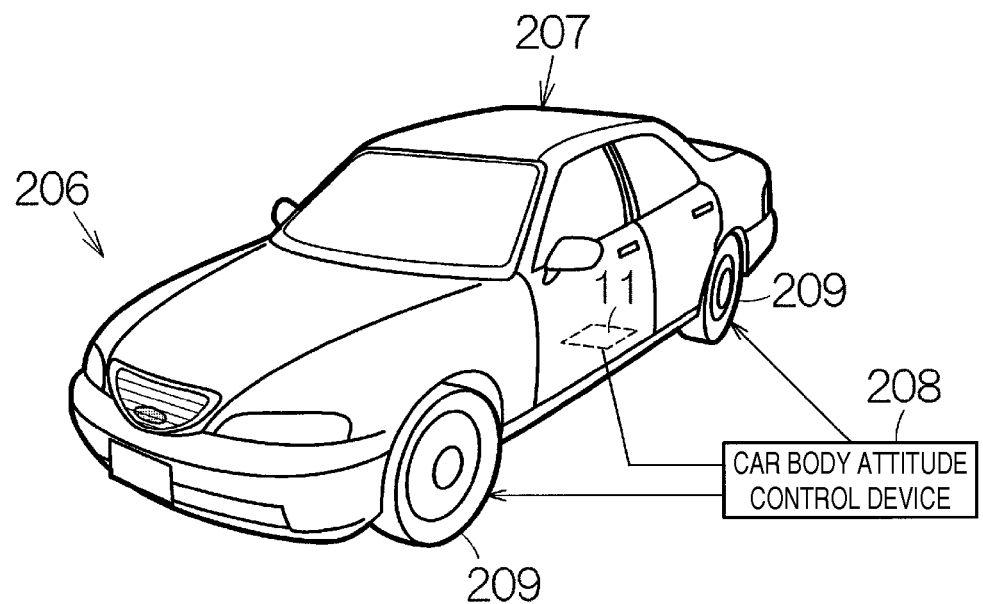
FIG. 15 is a conceptual diagram schematically showing the configuration of an automobile as a specific example of a moving object.

FIG. 15 schematically shows an automobile 206 as a specific example of a moving object. The gyro sensor 11 having the vibrator element 15 is incorporated in the automobile 206. The gyro sensor 11 can detect the attitude of a car body 207. A detection signal of the gyro sensor 11 can be supplied to a car body attitude control device 208. The car body attitude control device 208 can control, for example, the hardness of a suspension or brakes of individual wheels 209 according to the attitude of the car body 207. In addition, such attitude control can be used in various moving objects such as a bipedal walking robot, an aircraft, and a helicopter. In the realization of the attitude control, the gyro sensor 11 can be incorporated.

In addition, as described above, the embodiments have been described in detail. However, it will be able to be easily understood by those skilled in the art that many modifications are possible without substantially departing from the new matters and advantages of the invention. Therefore, all such modified examples are included within the scope of the invention.

For example, in the embodiments described above, an example has been described in which quartz crystal is used as a formation material as a vibrator element. However, it is possible to use a piezoelectric body material other than the quartz crystal. It is possible to use an oxide substrate such as aluminum nitride (AlN), lithium niobate (LiNbO$_3$), lithium tantalate (LiTaO$_3$), lead zirconate titanate (PZT), lithium tetraborate (Li$_2$B$_4$O$_7$), or langasite (La$_3$Ga$_5$SiO$_{14}$), a laminated piezoelectric substrate configured by laminating a piezoelectric body material such as aluminum nitride or tantalum pentoxide (Ta$_2$O$_5$) on a glass substrate, piezoelectric ceramics, or the like. Further, a term described along with a different term having a wider sense or the same meaning in the specification or the drawings at least once can be replaced with the different term in any place of the specification or the drawings. Further, the configurations and operations of the vibrator elements 15, the gyro sensor 11, the electronic apparatus, the moving object, and the like are also not limited to those described in the embodiments and various modifications are possible.

Further, in the embodiments described above, an example has been described in which the driving portion and the detection portion are separate vibrating arms. However, the driving portion and the detection portion can also be provided in the same vibrating arm.

Further, in the embodiments described above, each of the driving portion and the detection portion has been described using a vibrating arm in which one end is connected to a base portion and the other end is a free end. However, it is also possible to use a vibrating arm which is not provided with a free end and in which both ends are connected to a base portion or the like.

The entire disclosure of Japanese Patent Application No. 2013-069186, filed Mar. 28, 2013 is expressly incorporated by reference herein.

What is claimed is:

1. A vibrator element comprising:
a base having first and second sides;
first and second detection arms that extend from the first side of the base in a first direction, the first and second detection arms being provided parallel to each other in a second direction perpendicular to the first direction, the first and second detection arms swingably oscillating with respect to the first side in first and second vibration modes; and
first and second driving arms that extend from the second side of the base in a third direction opposite to the first direction, the first and second driving arms being provided parallel to each other in the second direction, the first and second driving arms swingably oscillating with respect to the second side in the first and second vibration modes,
wherein the first and second detection arms are located opposite to the first and second driving arms via the base, respectively,
the first and second detection arms and the first and second driving arms oscillate in up and down directions crossing a plane defined by the first, second and third directions,
in the first vibration mode, while a driving signal is applied to the first and second driving arms and the vibrator element is rotated around a rotation axis parallel to the third direction, the first and second driving arms move oppositely to one another in the up and down directions and the first and second detection arms move oppositely to one another in the up and down directions, wherein when the first driving arm moves in the up direction:
the second driving arm moves in the down direction;
the first detection arm moves in the down direction; and
the second detection arm moves in the up direction,
in the second vibration mode, while the driving signal is applied to the first and second driving arms and the vibrator element is rotated around the rotation axis, the first and second driving arms oscillate oppositely to one another in the up and down directions and the first and second detection arms oscillate oppositely to one another in the up and down directions, wherein when the first driving arm moves in the up direction:
the second driving arm moves in the down direction;
the first detection arm moves in the up direction; and
the second detection arm moves in the down direction, and
a ratio r = R2/R1 is between 0.15 and 6.0, wherein R2 is an equivalent series resistance of the second vibration mode and R1 is an equivalent series resistance of the first vibration mode.

2. The vibrator element according to claim 1, wherein the ratio r is between 0.3 and 3.0.

3. The vibrator element according to claim 1, wherein the ratio r is between 0.55 and 1.8.

4. The vibrator element according to claim 1, further comprising:
a film body which is formed on a surface of at least one of the first and second detection arms so as to adjust the ratio r.

5. The vibrator element according to claim 4, further comprising:
a removal mark which is formed adjacent to the film body on the surface of at least one of the first and second detection arms.

6. A gyro sensor having the vibrator element according to claim 1.

7. An electronic apparatus having the vibrator element according to claim 1.

8. A moving object having the vibrator element according to claim 1.

9. A vibrator comprising:
an integrated circuit housed in a package, the integrated circuit selectively providing a driving signal; and
a vibrator element housed in the package, the vibrator element receiving the driving signal, the vibrator element including:
a base having first and second sides;
first and second detection arms that extend from the first side of the base in a first direction, the first and second detection arms being provided parallel to each other in a second direction perpendicular to the first direction, the first and second detection arms swingably oscillating with respect to the first side in first and second vibration modes; and
first and second driving arms that extend from the second side of the base in a third direction opposite to the first direction, the first and second driving arms being provided parallel to each other in the second direction, the first and second driving arms swingably oscillating with respect to the second side in the first and second vibration modes,
wherein the first and second detection arms are located opposite to the first and second driving arms via the base, respectively,
the first and second detection arms and the first and second driving arms oscillate in up and down directions crossing a plane defined by the first, second and third directions,
in the first vibration mode, while a driving signal is applied to the first and second driving arms and the vibrator element is rotated around a rotation axis parallel to the third direction, the first and second driving arms oscillate oppositely to one another in the up and down directions and the first and second detection arms oscillate oppositely to one another in the up and down directions, and the first and second detection arms generate a first detection signal, wherein when the first driving arm moves in the up direction:
the second driving arm moves in the down direction;
the first detection arm moves in the down direction; and
the second detection arm moves in the up direction,
in the second vibration mode, while the driving signal is applied to the first and second driving arms and the vibrator element is rotated around the rotation axis, the first and second driving arms oscillate oppositely to one another in the up and directions and the first and second detection arms oscillate oppositely to one another in the up and down directions, and the first and second detection arms generate a second detection signal, wherein when the first driving arm moves in the up direction:
the second driving arm moves in the down direction;
the first detection arm moves in the up direction; and
the second detection arm moves in the down direction, and
a ratio r = R2/R1 is feedback adjustable based on the first and second detection signals, wherein R2 is an equivalent series resistance of the second vibration mode and R1 is an equivalent series resistance of the first vibration mode.

10. The vibrator according to claim 9,
wherein the ratio r is between 0.15 and 6.0.

11. The vibrator according to claim 9,
wherein the ratio r is between 0.3 and 3.0.

12. The vibrator according to claim 9,
wherein the ratio r is between 0.55 and 1.8.

13. The vibrator according to claim 9, further comprising:
a film body which is provided on a surface of at least one of the first and second detection arms to adjust the ratio r.

14. The vibrator according to claim 13, further comprising:
a removal mark which is provided adjacent to the film body on the surface of at least one of the first and second detection arms.

* * * * *